Oct. 24, 1967 J. D. LEIBOWITZ 3,349,362

PROGRAMMING SWITCH

Filed March 8, 1965

INVENTOR.
Joseph D. Leibowitz
BY
Delbert P. Warner
ATTORNEY

United States Patent Office 3,349,362
Patented Oct. 24, 1967

3,349,362
PROGRAMMING SWITCH
Joseph D. Leibowitz, Skokie, Ill., assignor to International Telephone and Telegraph Corporation, New York, N.Y., a corporation of Maryland
Filed Mar. 8, 1965, Ser. No. 437,868
7 Claims. (Cl. 339—18)

ABSTRACT OF THE DISCLOSURE

C-shaped springs are provided for interconnecting conductors on opposite faces of printed circuit boards. The springs provide good electrical connections between selected conductors and support tabs which may be gripped manually to enable quick changes in conductive paths from one pair of conductors to another.

This invention relates to switches and especially to switches of use in interconnecting conductors arrayed in patterns on opposite sides of a printed circuit card.

A number of switches are available for use in interconnecting conductors on opposite faces of a printed circuit board. Such interconnections establish matrices made up of electrical paths through the conducting strips. Generally, these switches include spring contacts which are fastened to the conducting strips and which are then selectively connected to each other by the insertion of suitable conducting bodies. These prior art devices exhibit disadvantages in varying degrees. Among these disadvantages are relatively large size, high cost of construction, great weight, and the difficulty of changing them from one setting to another and thus of changing programs in a matrix.

It is, therefore, an object of the present invention to provide a programming switch which makes it possible to quickly change programs in a conductor matrix;

It is a further object of the invention to reduce the size of a conductor matrix;

It is another object of the invention to simplify the construction of a conductor matrix to reduce weight;

It is yet a further object of the invention to produce an improved switch and conductor array at a reduced unit cost;

It is still another object to provide a conductor matrix for mating with an improved switch.

The foregoing objects and others ancillary thereto may preferably be accomplished by providing a C-shaped or U-shaped spring having raised contact surfaces near the ends of its inner face for contacting electrical conductors. A tab, available to serve as a handle, is fastened to the spring so that it protrudes beyond the outer edge of the spring. The spring may be used to connect any two conductors having the proper spacing, however, it is intended to have particular application to arrays of conductors on opposite faces of a printed circuit. Applied through openings in a printed circuit board and then twisted by turning the attached tab, a spring can be used to make contact between any two conductors on the faces of the printed circuit board. In this way, a plurality of such springs can be used to establish a matrix of conductors, or a program, between various terminals connected to the conductors. Such a matrix, or program, can be quickly modified by changing the position of one or more springs.

The novel features that I consider to be characteristic of my invention are set forth with particularity in the appended claims. The invention itself, however, both as to its organization and its method of operation, together with additional objects and advantages thereof, will be best understood from the following description of a specific embodiment when read in connection with the accompanying drawings, in which:

Figure 1:
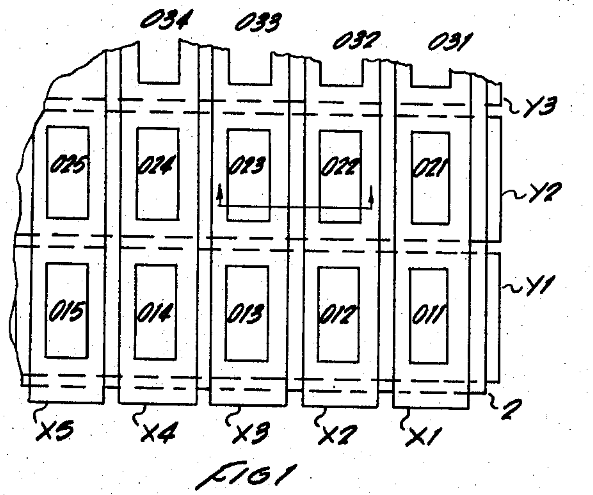
FIG. 1 shows a view of a printed circuit board having a plurality of conductors and openings, which is of use in the practice of this invention.

Attention is directed to FIG. 1 for a representation of a printed circuit board of use in the practice of this invention. In FIG. 1, an insulating board is shown on the faces of which are mounted a plurality of conductor strips X1, X2, X3, X4, X5 . . . and Y1, Y2, Y3 . . . which thus form two arrays of conductors separated by the insulating board. In order to enable the connection of desired X and Y conductors, rectangular openings O11, O12 . . . O15 . . . O21, O22 . . . O25 . . . O31 . . . O34 . . . are cut through the conductors and the insulating board.

Connections between desired X and Y conductive strips in FIG. 1 can be made by passing connectors through appropriate openings and fastening their ends to respective X and Y conductive strips. A connector which has proven very successful and which constitutes an embodiment of a major portion of the invention is shown in section in FIG. 2. An enlarged view of a section of the board 2 of FIG. 1 is also shown in FIG. 2 to illustrate the relationship of a typical connector to rectangular openings such as O22 and O23 of FIG. 1.

Figure 2:
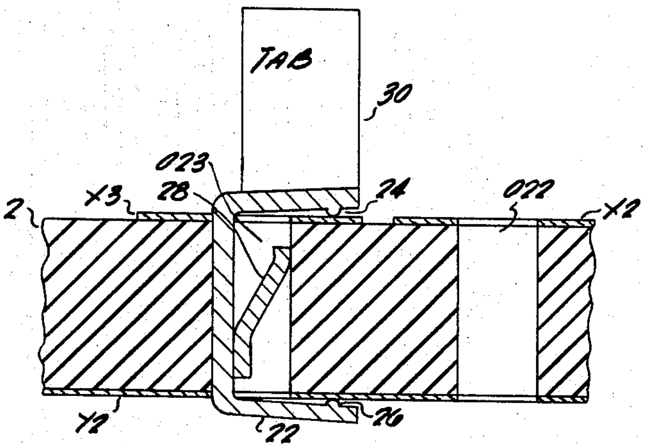
FIG. 2 is a sectional view, on an enlarged scale, of parts of FIG. 1 and includes a sectional view of a connector made in accordance with the invention.

The view of the invention embodied in the connector, shown in FIG. 2 clearly shows that conductors such as X3, arrayed on one side of an insulating base 2, can be quickly and securely connected to conductors such as Y2 on the opposite side of the same insulating base. By making a number of such connections with a plurality of conductors, it is possible to program a conducting matrix made up of conductors on opposite sides of an insulating body.

The connector 22 shown in a sectional view in FIG. 2 has a C-shaped, or perhaps what may be described more accurately as a U-shaped, cross section. In any case, the connector 22 will be made of material having many of the characteristics of a spring so that suitable contacts can be made and maintained between the contact areas 24 and 26 and respective conductive strips such as X3 and Y2. In a preferred embodiment, the whole of connector 22 will be made of a spring material which will conduct electricity; however, a nonconductor or insulator might be used for the main body 22 with a conductive insert or layer to connect contacts 24 and 26.

An inner spring 28 is provided to hold the contacts 24 and 26 firmly against the conductors X3 and Y2. This spring 28 is fastened firmly to the connector 22 and serves also to retain the connector 22 firmly within the opening O23.

Figure 3:
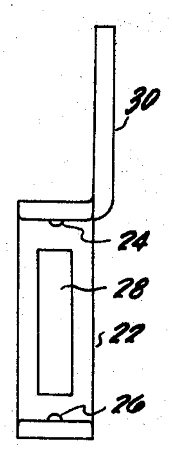
FIG. 3 is a plan view of a connector in accordance with that shown in partial section in FIG. 2.

The connector 22 is shown in perspective in FIG. 3 with its contact areas 24 and 26, its inner spring 28 and a tab 30. In the position of the connector in FIG. 3, it can be seen that the connector may be made narrow enough to fit into the narrow dimensions of the rectangular openings cut through the insulating base 2 of FIG. 2. A preferred embodiment of the connector will also be short enough in its dimensions perpendicular to the paper as drawn in FIG. 3 to fit within the long dimension of the rectangular openings. The connector therefore may be inserted through the rectangular openings and then be turned by twisting tab 30 so that it assumes the position shown in FIG. 2 with the contacts 24 and 26 firmly in contact with X3 and Y2, respectively, after being wiped across X3 and Y2.

When the connector 22 is inserted through an opening, such as that illustrated in FIG. 2, and is rotated by twisting the tab 30, the contacts 24 and 26 will wipe the surfaces of the corresponding conductors X3 and Y2. This will assure that a good contact is made through X3 and Y2. The inner spring 28 on the connector 22 will serve to fix the contacts 24 and 26 in a relatively immobile position relative to the conductors X3 and Y2 even in the presence of heavy vibrations.

Figure 4:
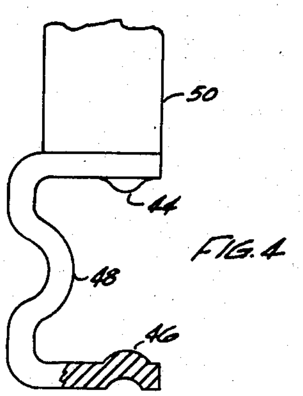
FIG. 4 is a view, partially in section, of a connector in accordance with an embodiment of the invention.
Figure 5:
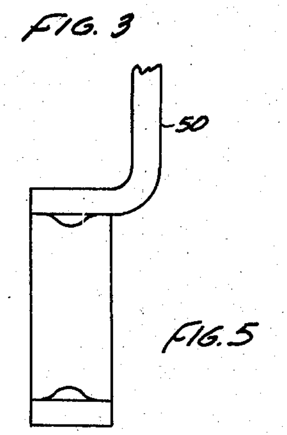
FIG. 5 is another view of the connector shown in FIG. 4.

FIGURES 4 and 5 show views of a connector 22' which possesses the advantage over the connector 22 of being much easier to make in large quantities. Connector 22' can be formed from a single sheet of metal by a four step progressive die or other means and then cut-off and heat treated to restore the spring-like qualities of the metal.

The dimensions of 22' are critical, but desired tolerances may readily be realized with conventional manufacturing procedures. For example, the spacing between contacts 44 and 46 can be held to tolerances which assure good connections with the conductors on the printed circuit boards. The protrudence 48 can readily to dimensioned to serve as a spring to help secure the contacts 44 and 46 as they wipe across the faces of the conductors and to hold them in position after they stop. The protrudence 48 may also be shortened and given a deeper bend, if found desirable, so that it can wedge against the inner wall of one of the rectangular openings in the manner of the spring 28. The dimensions of the tab 50 are not critical.

The connector may be formed from a sheet of beryllium copper, phospher bronze or similar material of suitable thickness. Typically, a piece of metal of relatively large size will have a portion formed to the desired shape, the shaped piece will be cut off, it will be heat treated and then a gold finish will be applied over a silver finish so that contacts 44 and 46 can make good connections.

While the principles of the invention have been described above in connection with specific apparatus and applications, it is to be understood that this description is made only by way of example and not as a limitation on the scope of the invention.

What is claimed is:

1. A programming switch comprising:
means enabling an operator to manually modify a conductive matrix, including isolated conductors supported on opposite faces of a printed circuit board, by rearranging conductive connections between selected isolated conductors on opposite faces of the board;
said means including a C-shaped spring body;
means on said spring body for contacting conductors on opposite faces of the board;
said C-shaped spring body including conductive portions for completing electrical connections between said conductors on two faces of the board; and
said C-shaped spring body including tab means connected to said spring body to provide a handle to enable manual positioning of said spring body in contact with desired faces of the board.

2. A programming switch substantially as claimed in claim 1, in which:

an inner spring is fastened to the C-shaped spring body to lodge between said body and a wall of the board to help hold the C-shaped spring body in position.

3. A programming switch substantially as claimed in claim 1, in which:
a spring integral to the C-shaped spring body is positioned to lodge said body between the walls of the element to help hold the C-shaped spring body in position.

4. A programming switch substantially as claimed in claim 1, including a printed circuit board in which
the conductors form rows on each face of the board;
the rows of conductors on one face are arranged at an angle to the rows on the other face; and
openings are cut through said layer to permit said C-shaped spring body to be inserted through said board layer to make desired contacts between a conductor on each face of said board.

5. A programming switch substantially as claimed in claim 4, in which:
said openings are substantially rectangular and of a size to receive said C-shaped spring body.

6. A programming switch substantially as claimed in claim 5, in which:
said C-shaped spring body, after insertion through said opening, responds to a twist on said tab means to engage and grip conductors on opposite faces of said board.

7. A programming switch comprising:
a printed circuit board including a plurality of openings therethrough;
a plurality of rows of conductive material arranged on opposite faces of the board, all the rows on one face of the board being arranged at an angle to the rows on the other face,
means enabling modification by hand of electrical connections through the openings in the board and between the rows of conductive material on opposite faces of the printed circuit board;
said means including a conductive C-shaped spring body;
means associated with said C-shaped spring body for contacting said conductive material on opposite faces of the printed circuit board, said means and said C-shaped spring body providing a conductor between selected rows of conductive material; and
tab means associated with said C-shaped spring body to form a handle by means of which the C-shaped spring body can be manually positioned.

References Cited

UNITED STATES PATENTS

| | | | |
|---|---|---|---|
| 2,433,358 | 12/1947 | Garberding | 339—220 X |
| 2,580,269 | 12/1951 | Alvarez | 339—214 X |
| 2,756,485 | 7/1956 | Abramson et al. | 29—155.5 |
| 2,945,163 | 7/1960 | Kilby et al. | 339—17 X |
| 2,966,652 | 12/1960 | Parstorfer | 339—220 X |

FOREIGN PATENTS

| | | |
|---|---|---|
| 108,048 | 7/1927 | Austria. |

MARVIN A. CHAMPION, *Primary Examiner.*

PATRICK A. CLIFFORD, *Examiner.*